United States Patent
Jeon

(10) Patent No.: US 7,663,912 B2
(45) Date of Patent: Feb. 16, 2010

(54) NON-VOLATILE MEMORY DEVICE AND METHOD OF FABRICATING THE SAME

(75) Inventor: Yoo Nam Jeon, Kyungki-Do (KR)

(73) Assignee: Hynix Semiconductor Inc., Icheon-si (KR)

(*) Notice: Subject to any disclaimer, the term of this patent is extended or adjusted under 35 U.S.C. 154(b) by 132 days.

(21) Appl. No.: 11/770,685

(22) Filed: Jun. 28, 2007

(65) Prior Publication Data
US 2008/0157174 A1 Jul. 3, 2008

(30) Foreign Application Priority Data
Dec. 27, 2006 (KR) ...................... 10-2006-0134893

(51) Int. Cl.
*G11C 16/04* (2006.01)
(52) U.S. Cl. .................... 365/185.01; 365/185.06; 365/185.26; 365/185.33; 257/315
(58) Field of Classification Search ............ 365/185.01, 365/185.06, 185.1, 185.26, 185.33; 257/321, 257/315; 438/264
See application file for complete search history.

(56) References Cited

U.S. PATENT DOCUMENTS

| 2001/0001720 A1* | 5/2001 | Clampitt et al. ............ 438/257 |
| 2001/0020718 A1* | 9/2001 | Takahashi et al. ........... 257/326 |
| 2002/0028541 A1* | 3/2002 | Lee et al. .................... 438/149 |
| 2002/0038877 A1* | 4/2002 | Ichige et al. ................ 257/296 |
| 2003/0168693 A1* | 9/2003 | Yi et al. ...................... 257/316 |
| 2004/0016956 A1* | 1/2004 | Choi et al. .................. 257/315 |
| 2004/0075134 A1* | 4/2004 | Lin et al. .................... 257/324 |
| 2005/0006695 A1* | 1/2005 | Lee et al. .................... 257/315 |

FOREIGN PATENT DOCUMENTS

| JP | 2003-197789 | 7/2003 |
| KR | 10-2005-0002244 A | 1/2005 |
| KR | 10-2005-0075631 A | 7/2005 |
| KR | 10-2006-0000797 A | 1/2006 |
| KR | 10-2006-0067058 | 6/2006 |
| KR | 10-2006-075442 | 7/2006 |
| KR | 10-2006-0099157 | 9/2006 |

* cited by examiner

*Primary Examiner*—Son Dinh
*Assistant Examiner*—Harry W Byrne
(74) *Attorney, Agent, or Firm*—Marshall, Gerstein & Borun LLP

(57) ABSTRACT

A non-volatile memory device and a method of fabricating the same are disclosed. The method includes the steps of: providing a semiconductor substrate having isolation layers in an isolation region, a tunnel insulating layer formed between the isolation layers, and first electron charge layers formed between the isolation layers, wherein the isolation layers comprise projections extending higher than the semiconductor substrate; etching the first electron charge layers, thereby reducing the thickness of the first electron charge layers and exposing sidewalls of the isolation layers; performing a first etch process to reduce the width of the projections; forming second electron charge layers between the projections on the first electron charge layers; and performing a second etch process to remove the projections between the second electron charge layers.

11 Claims, 4 Drawing Sheets

US 7,663,912 B2

NON-VOLATILE MEMORY DEVICE AND METHOD OF FABRICATING THE SAME

CROSS-REFERENCE TO RELATED APPLICATION

The priority of Korean patent application number 10-2006-134893, filed on Dec. 27, 2006, the disclosure of which is incorporated by reference in its entirety, is claimed.

BACKGROUND OF THE INVENTION

The invention relates, in general, to non-volatile memory devices and, more particularly, to a non-volatile memory device and a method of fabricating the same, in which a floating gate having an increased surface area can be formed by employing an Advanced Self-Aligned Shallow Trench Isolation (ASA-STI) process.

A general non-volatile memory device is adapted to store data by using a program or erasure operation for injecting or discharging electrons into or from a floating gate through Fowler-Nordheim(F-N) tunneling. As described above, the non-volatile memory device necessarily requires floating gates, which are isolated from one another on an element basis, in order to store information.

The conventional isolated floating gate is formed by laminating first and second polysilicon layers between isolation layers. In this case, the second polysilicon layer must be formed thickly by taking the coupling ratio of a cell into consideration. However, if the thickness of the second polysilicon layer is too thick, the etch thickness of the patterning process increases, resulting in residual polysilicon. Thus, a problem arises because the operation of the device is adversely affected. In order to solve the problem, it is advantageous to reduce the thickness of the second polysilicon layer. However, there are another problems due to the coupling ratio of the cell.

In order to solve the problem, an ASA-STI process for performing primary patterning of the floating gate and the formation of trenches at a time has been employed. The process can solve an overlap problem between the floating gate and the isolation region, but the surface area of the floating gate is limited because the size of the polysilicon layer of the floating gate is determined by the isolation region.

Due to this, the coupling ratio decreases, and the isolation layer between the floating gates is removed because of degraded cycling characteristics. Accordingly, there is a limit to the lowering of the Effective Field Height (EFH).

SUMMARY OF THE INVENTION

Accordingly, the invention addresses the above problems, and discloses a non-volatile memory device and a method of fabricating the same, in which the coupling ratio of a cell can be improved by increasing the surface area of a floating gate through an ASA-STI process. Further, the cycling characteristic and the inter-cell interference phenomenon can be improved by controlling the EFH of an isolation layer.

According to an aspect of the invention, there is provided a method of fabricating a non-volatile memory device, including the steps of: providing a semiconductor substrate having isolation layers in an isolation region, a tunnel insulating layer formed between the isolation layers, and first electron charge layers formed between the isolation layers, wherein the isolation layers comprise projections extending higher than the semiconductor substrate; etching the first electron charge layers, thereby reducing the thickness of the first electron charge layers and exposing sidewalls of the isolation layers; performing a first etch process to reduce the width of the projections; forming second electron charge layers between the projections on the first electron charge layers; and performing a second etch process to remove the projections between the second electron charge layers.

According to another aspect of the invention, there is provided a non-volatile memory device, including isolation layers formed in an isolation region of a semiconductor substrate and projected higher than the semiconductor substrate, a tunnel insulating layer formed on an active region, an electron charge layer formed on the tunnel insulating layer to be higher than the isolation layers and having edges overlapped with the isolation layers, and a dielectric layer and a conductive layer formed over the isolation layers and the electron charge layer.

DETAILED DESCRIPTION OF EMBODIMENTS

Now, specific embodiments are described with reference to the accompanying drawings.

FIGS. 1A to 1H are cross-sectional views illustrating a method of fabricating a non-volatile memory device according to one embodiment of the present invention.

Figure 1A:
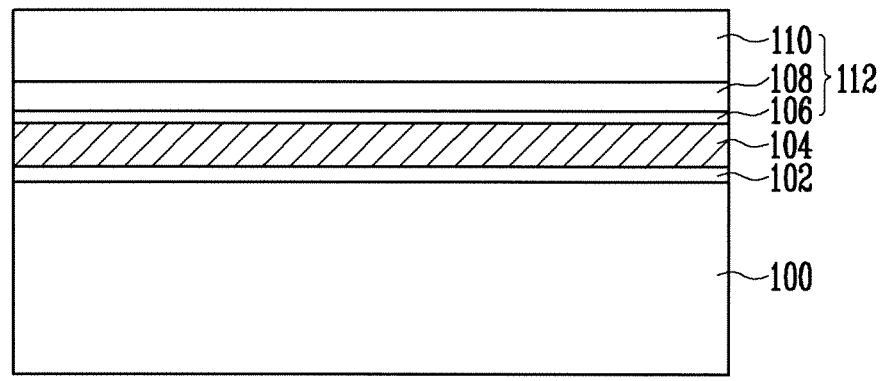
FIGS. 1A to 1H are cross-sectional views illustrating a method of fabricating a non-volatile memory device according to one embodiment of the invention.

Referring to FIG. 1A, a tunnel insulating layer 102, a first electron charge layer 104 for a floating gate and an isolation mask 112 are formed over a semiconductor substrate 100. The isolation mask 112 can have a stack structure of a buffer oxide layer 106, a nitride layer 108 and a hard mask 110. The nitride layer 108 is used as an etch-stopper in a subsequent Chemical Mechanical Polishing (CMP) process for forming an isolation layer. The hard mask 110 can be formed from nitride, oxide, SiON, or amorphous carbon. Furthermore, the first electron charge layer 104 is for the purpose of forming a floating gate in the non-volatile memory device, and can be formed of polysilicon.

Figure 1B:
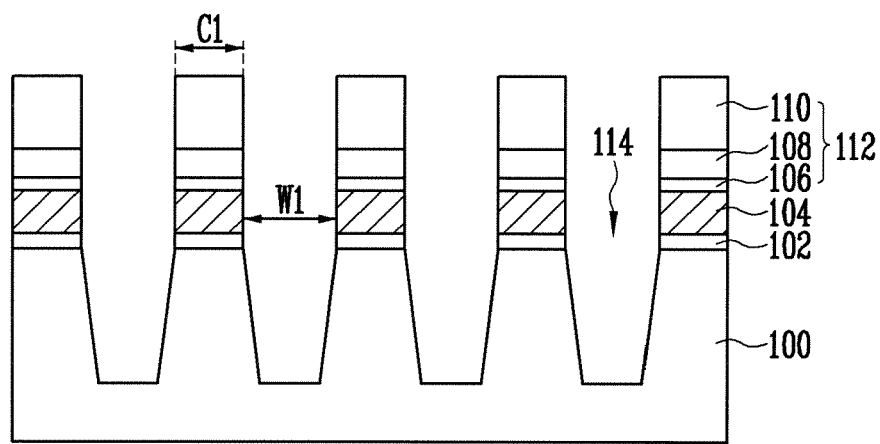

Referring to FIG. 1B, the isolation mask 112, the first electron charge layer 104 and the tunnel insulating layer 102 of an isolation region are etched to expose the isolation region of the semiconductor substrate 100. Specifically, a photoresist (not illustrated) is coated on the isolation mask 112, and exposure and development processes are performed to form a photoresist pattern (not illustrated) through which the isolation mask 112 is exposed. The isolation region of the isolation mask 112 is removed using an etch process employing the photoresist pattern. The photoresist pattern is then removed. Thereafter, the first electron charge layer 104 and the tunnel insulating layer 102 are etched using an etch process employing the isolation mask 112, so that the semiconductor substrate 100 in the isolation region is exposed. In the process of etching the nitride layer 108, the buffer oxide layer 106, the first electron charge layer 104 and the tunnel insulating layer 102, the hard mask 110 is also etched, thereby reducing the thickness of the remaining portion of the hard mask 110.

Thereafter, the semiconductor substrate 100 in the exposed isolation region is etched using an etch process to form trenches 114. As described above, the trenches 114 can be preferably formed by means of an ASA-STI process. In this case, an etch process may be performed so that the sidewalls of the trenches 114 are inclined at an angle of 85 to 90 degrees. Accordingly, the first electron charge layer 104 has a first width C1, and the distance between the adjacent electron charge layers 104 is a first width W1.

Figure 1C:
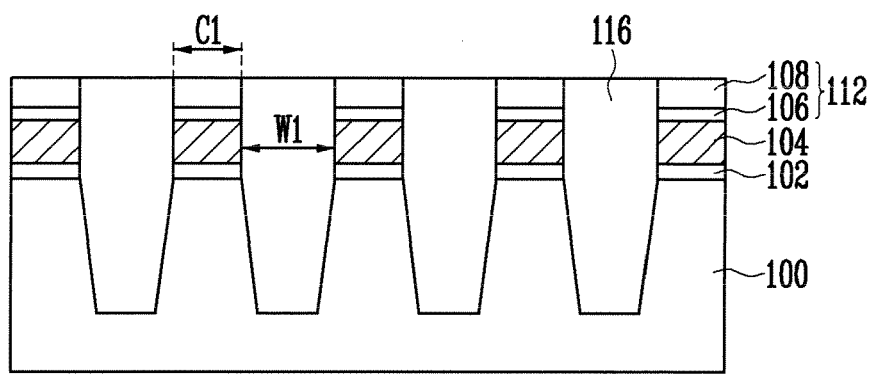

Referring to FIG. 1C, insulating material is deposited on the isolation mask 112 and the trenches 114, thus forming an isolation layers 116. The insulating material is polished until the nitride layer 108 of the isolation mask 112 is exposed. The insulating material can be formed of oxide, preferably a single layer employing one of High Density Plasma (HDP) oxide, Spin On Glass (SOG), Boron-Phosphorus Silicate Glass (BPSG), Plasma Enhanced Tetra Ortho Silicate Glass (PETEOS), Undoped Silicate Glass (USG), Phosphorus Silicate Glass (PSG) and Inter Poly Oxide (IPO), or a combination of the foregoing.

Further, such polishing can be performed using a CMP process. Then, isolation layers 116, which are projected higher than the semiconductor substrate 100, are formed in the isolation region. In this case, the top surface of the isolation layers 116 has a first width W1, and in a similar way, the first electron charge layer 104 has a first width C1.

Before the isolation layers 116 are formed, an oxidization process may be further performed in order to remove etch damage that has been generated at the sidewalls and bottom of the trenches 114 in the etch process for forming the trenches 114. Further, a liner oxide layer may be further formed in order to improve the burial characteristic of the trenches 114.

Figure 1D:
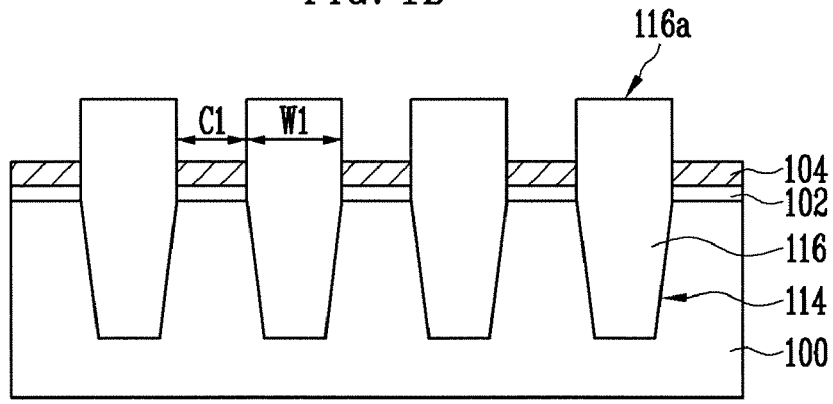

Referring to FIG. 1D, the nitride layer 108 and the buffer oxide layer 106 remaining on the isolation mask 112 are removed in order to reduce the thickness of the first electron charge layer 104 so that the sidewalls of the isolation layers 116 are exposed. A part of the first electron charge layer 104 is then etched. The nitride layer 108 can be removed using a phosphoric acid ($H_3PO_4$) solution. In the etch process of the nitride layer 108, the buffer oxide layer 106 also can be removed.

The etch process of the first electron charge layer 104 can be performed using dry etch or wet etch. In particular, the etch process of the first electron charge layer 104 can be performed using an etch recipe having a high etch selectivity with respect to the first electron charge layer 104 relative to the isolation layers 116 in order to prevent the isolation layers 116 from being etched in the etch process.

In an embodiment of the invention, the isolation layers 116 are formed of an oxide layer and the first electron charge layer 104 is formed of a polysilicon layer as described above. In this case, the etch process of the first electron charge layer 104 is performed using an etch recipe having a high etch selectivity with respect to the polysilicon layer rather than the oxide layer. Accordingly, the isolation layers 116 respectively having projections 116a are formed in the isolation region. In a similar way, the projections 116a of the isolation layers 116 have a first width W1, and a distance between adjacent projections 116a of the isolation layers 116 becomes a first distance C1.

Figure 1E:
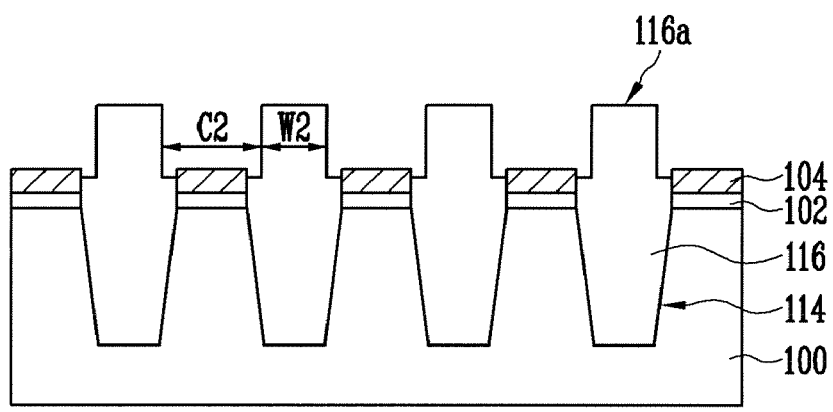

Referring to FIG. 1E, in order to secure a wider space in the X-direction on the active region of the semiconductor substrate 100, a first etch process for etching the sidewalls of the projections 116a of the isolation layers 116 is performed. The first etch process can be performed using wet etch or dry etch. The dry etch can be performed using isotropic dry etch. Thus, the width of the projections 116a of the isolation layers 116 is reduced to a second width W2 narrower than the first width W1. In contrast, a distance between adjacent projections 116a of the isolation layers 116 is increased to a second distance C2 wider than the first distance C1. That is, the distance between adjacent projections 116a is increased as much as the reduction in width W1-W2 of the isolation layers 116.

Figure 1F:
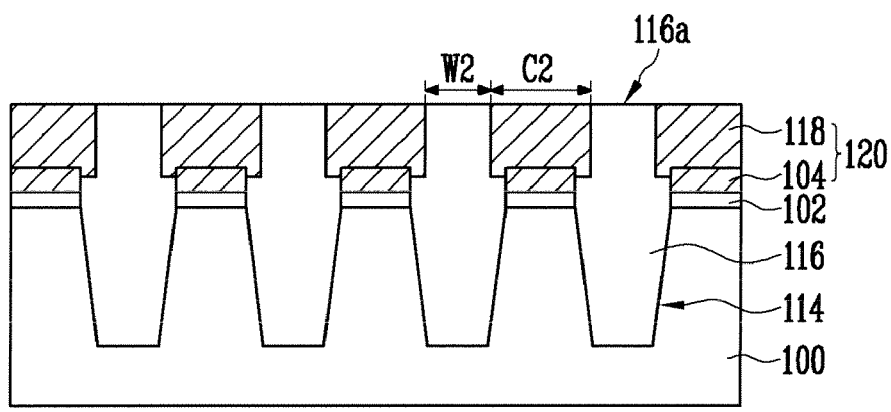

Referring to FIG. 1F, a second electron charge layer 118 is deposited over the projections 116a of the isolation layers 116 and the first electron charge layer 104. The polysilicon layer is polished until the projections 116a are exposed. Such polishing can be performed using a CMP process. Thus, edges of the second electron charge layer 118 are overlapped with the isolation layers 116 and the second electron charge layer 118 is remained between the projections 116a of the isolation layers 116. Accordingly, the second electron charge layer 118 has the width C2, which is wider than the width C1 of the first electron charge layer 104 as much as the reduction in width W1-W2 of the projections 116a. As a result, the first electron charge layer 104 and the second electron charge layer 118 constitute an electron charge layer 120 for forming a floating gate.

As described above, the area of the electron charge layer 120 is increased due to the increased width of the second electron charge layer 118, and the surface area of the electron charge layer 120 is increased accordingly. Thus, the cell coupling ratio with a subsequent control gate (not illustrated) can be improved, and an operating voltage can be lowered or program and erase speeds can be enhanced accordingly.

In addition, according to the disclosure, the second electron charge layer 118 is formed through a self-aligned method using a CMP process after being deposited using the projections 116a without using existing mask/etch processes. Thus, a problem in which overlap between the first electron charge layer 104 and the second electron charge layer 118 is varied on a cell basis can be improved. Accordingly, the distance between the control gate and the semiconductor substrate 100 can be maintained constantly over entire cells, and the cycling characteristic can be improved.

Figure 1G:
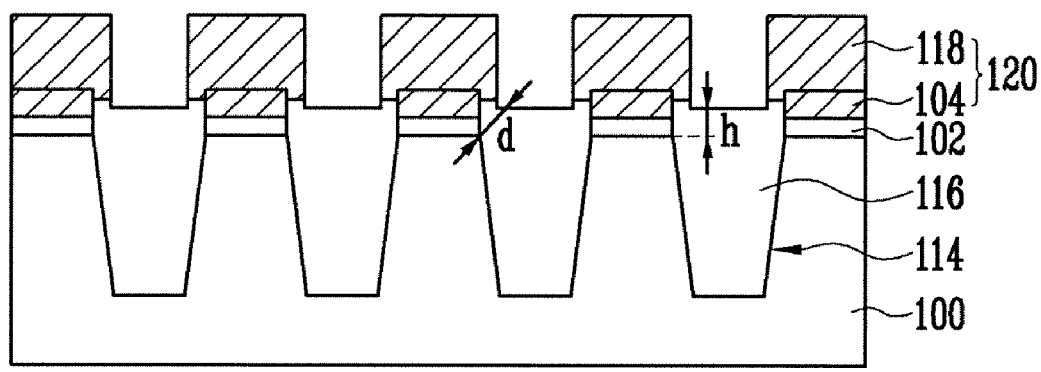

Referring to FIG. 1G, a second etch process is performed to remove the projections 116a between the second electron charge layer 118. The second etch process can be performed using an etch recipe having a high etch selectivity with respect to the isolation layers 116 relative to the first and second electron charge layers 104 and 118 in order to prevent the first and second electron charge layers 104 and 118 from being etched.

In an embodiment of the invention, the first and second electron charge layers 104 and 118 are formed from a polysilicon layer, and the isolation layers 116 are formed from an oxide layer. Thus, the second etch process is performed using an etch recipe having a high etch selectivity with respect to the oxide layer rather than the polysilicon layer.

As described above, the projections 116a are removed to improve the EFH of the second electron charge layer 118, which has a great influence on the coupling ratio of a cell as a non-volatile memory device becomes more highly integrated. The EFH h can be controlled such that the height h of the projection of the isolation layers 116 is lower than the height of the first electron charge layer 104, but higher than the height of the semiconductor substrate 100 through the etch process of the projections 116a, as illustrated in FIG. 1G.

Meanwhile, the isolation layers 116 between the floating gates (not illustrated) are removed along the surface of the polysilicon of the electron charge layer 120. Further, a distance between polysilicon of the control gate and the top surface of the active region of the semiconductor substrate 100 becomes relatively long due to the width of the polysilicon layer. Accordingly, although the same EFH as that of the prior art is secured, the cycling characteristic can be improved.

Figure 1H:
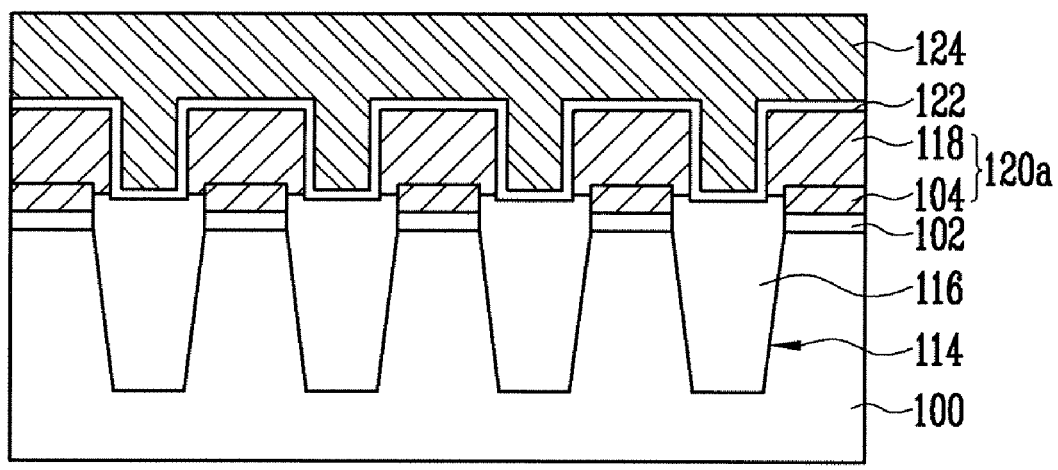

Referring to FIG. 1H, a dielectric layer 122 and a conductive layer (not illustrated) for a control gate are formed over the isolation layers 116 and the second electron charge layer 118. The dielectric layer 122 can have an Oxide-Nitride-Oxide (ONO) stack structure. The conductive layer for the control gate can be formed of a polysilicon layer or a metal layer, preferably a polysilicon layer.

Thereafter, the conductive layer for the control gate, the dielectric layer 122 and the electron charge layer 120 are patterned using a typical etch process. Thus, a floating gate 120a comprising the first electron charge layer 104 and the second electron storage layer 118, and a control gate 124 comprising the conductive layer for the control gate are formed.

Figure 2A:
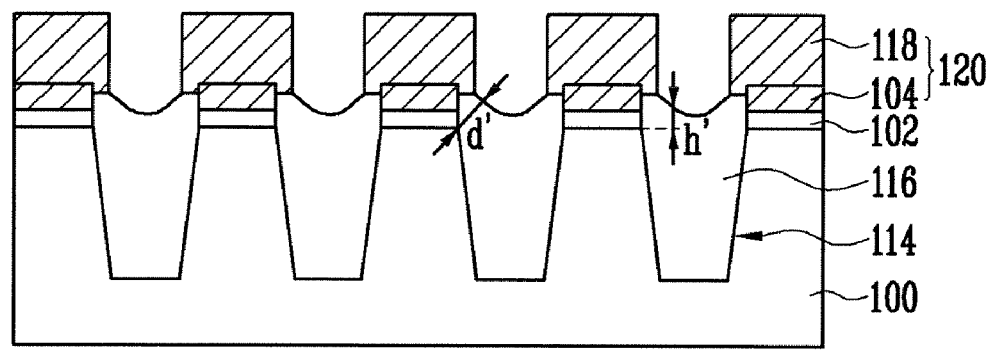
FIGS. 2A and 2B are cross-sectional views illustrating a method of fabricating a non-volatile memory device according to another embodiment of the invention.
Figure 2B:
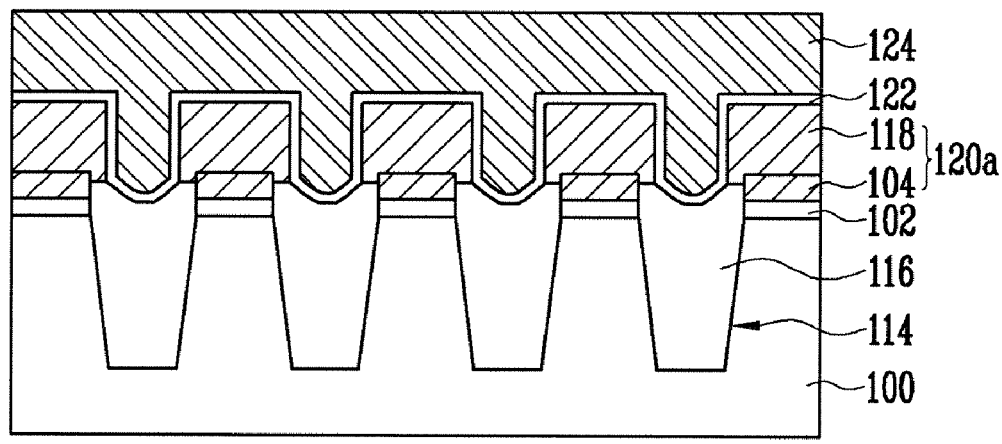

FIGS. 2A and 2B are cross-sectional views illustrating a method of fabricating a non-volatile memory device according to another embodiment of the invention.

In another embodiment, processes described in FIGS. 1A to 1G are performed.

Referring to FIG. 2A, second etch process is performed in order to remove the projections 116a of the isolation layers 116 between the second electron charge layers 118. The second etch process can be performed using an etch recipe having a high etch selectivity with respect to the isolation layers 116 rather than the first and second electron charge layers 104 and 118 in order to prevent the first and second electron charge layers 104 and 118 from being etched.

In another embodiment of the invention, the first and second electron charge layers 104 and 118 are formed from a polysilicon layer, and the isolation layers 116 are formed from an oxide layer. Thus, the second etch process is formed using an etch recipe having a high etch selectivity with respect to the oxide layer rather than the polysilicon layer.

In particular, the second etch process can be performed using a wet etch process having a slow etch rate at the sidewall portions of the electron charge layer 120 or a dry etch process having a slow etch rate at the sidewall portions of the electron charge layer 120 due to the formation of numerous byproducts when etching the isolation layers 116. Thus, the central portion of the isolation layers 116 is further etched compared with the sidewall portion of the electron charge layer 120, resulting in a rounded shape illustrated in FIG. 2A. In this case, in order to prevent a breakdown voltage characteristic from being degraded due to the second etch process, the EFH h' is controlled in such a manner that the height h' of the projection of the isolation layers 116 is lower than the height of the first electron charge layer 104, but higher than the height of the semiconductor substrate 100.

The EFH h' can be lowered by etching the central portion of the isolation layers 116 while maintaining a distance d' between a subsequent control gate and the top surface of the active region of the semiconductor substrate 100 to be the same as the distance d in FIG. 1G. Accordingly, the subsequent control gate can be formed deeply between the floating gates. It is therefore possible to reduce parasitic capacitance, and improve the interference phenomenon between cells and thus the threshold voltage (Vth) distributions of a cell.

Referring to FIG. 2B, a dielectric layer 122 and a conductive layer (not illustrated) for a control gate are formed over the isolation layers 116 and the second electron charge layer 118. The dielectric layer 122 can have an Oxide-Nitride-Oxide (ONO) stack structure. The conductive layer for the control gate can be formed of a polysilicon layer or a metal layer, preferably a polysilicon layer.

Thereafter, the conductive layer for the control gate, the dielectric layer 122 and the electron charge layer 120 are patterned using a typical etch process. Thus, a floating gate 120a comprising the first electron charge layer 104 and the second electron storage layer 118, and a control gate 124 comprising the conductive layer for the control gate are formed.

As described above, the invention can have the following effects.

The area of the floating gate is increased using an ASA-STI process, and therefore the surface area of the floating gate is increased. It is therefore possible to increase the coupling ratio of a cell, and lower an operating voltage or improve the program and erase speeds.

The upper electron charge layer is deposited using the projection of the isolation layer without using the existing mask/etch processes, and is then formed through a self-aligned method using a CMP process. Thus, the problem in which overlap varies on a cell-by-cell basis can be improved. Accordingly, the distance between the control gate and the semiconductor substrate can be kept constant over entire cells, and the cycling characteristic can be improved.

The EFH can be lowered by etching the central portion of the isolation layer while maintaining a minimal distance between the top surface of the active region of the semiconductor substrate and the control gate. Thus, the control gate can be located deeply between the floating gates. It is thus possible to improve the inter-cell interference phenomenon and the threshold voltage (Vth) distributions of a cell.

Although the foregoing description has been made with reference to the specific embodiment, it is to be understood that changes and modifications of the disclosure may be made by the skilled artisan without departing from the spirit and scope of the disclosure and appended claims.

What is claimed is:

1. A method of fabricating a non-volatile memory device, comprising the steps of:

providing a semiconductor substrate having isolation layers in isolation regions, a tunnel insulating layer formed between the isolation layers, and first electron charge layers formed between the isolation layers, wherein the isolation layers comprise projections extending higher than the semiconductor substrate;

etching the first electron charge layers to reduce the thickness of the first electron charge layers and exposing sidewalls of the isolation layers;

performing a first etch process to reduce the width of the projections;

forming second electron charge layers over the first electron charge layers between the projections of the isolation layers; and performing a second etch process to etch the projections of the isolation layers between the second electron charge layers so that a height of the isolation layers is reduced after forming the second electron charge layers.

2. The method of claim 1, wherein each of the first electron charge layers and the second electron charge layers comprises a polysilicon layer.

3. The method of claim 1, wherein the isolation layers comprise an oxide layer.

4. The method of claim 1, wherein the step of etching the first electron charge layers comprises wet etching or dry etching with an etch recipe having a high etch selectivity with respect to the first electron charge layers relative to the isolation layers.

5. The method of claim 1, wherein the first etch process comprises wet etching or isotropic dry etching.

6. The method of claim 1, wherein the step of forming the second electron charge layers comprises the steps of:

depositing a second electron charge layer on the projections and the first electron charge layers; and polishing the second electron charge layer until the projections are exposed.

7. The method of claim 1, wherein the second electron charge layers have a width wider than that of the first electron charge layers by an amount equal to the reduction in the width of the projections obtained in the first etch process.

8. The method of claim 1, wherein the second etch process comprises using an etch recipe having a high etch selectivity with respect to the isolation layers relative to the first and second electron charge layers.

9. The method of claim 1, wherein the second etch process comprises wet etching or dry etching with a slow etch rate at the sidewalls of the first and second electron charge layers.

10. The method of claim 1, wherein, after the second etch process, a top surface of the isolation layer between the first electron charge layers has a rounded concaved shape.

11. The method of claim 1, wherein, after the second etch process, the isolation layer has a height lower than that of the first electron charge layers, but higher than that of the semiconductor substrate.

* * * * *